(12) United States Patent
Huang et al.

(10) Patent No.: US 6,344,395 B1
(45) Date of Patent: Feb. 5, 2002

(54) METHOD FOR IMPLEMENTING NON-VOLATILE MEMORY ON A SEMICONDUCTOR SUBSTRATE

(75) Inventors: Chih-Jen Huang, Hsin-Chu; Chia-Te Wu, Tai-Hsi Hsiang, both of (TW)

(73) Assignee: United Microelectronics Corp. (TW)

( * ) Notice: Subject to any disclaimer, the term of this patent is extended or adjusted under 35 U.S.C. 154(b) by 1 days.

(21) Appl. No.: 09/624,324

(22) Filed: Jul. 24, 2000

(51) Int. Cl.[7] .............................................. H01L 21/336
(52) U.S. Cl. ....................................... 438/262; 438/257
(58) Field of Search .................................. 438/257, 262

(56) References Cited

PUBLICATIONS

D.E. Oates et al in "Tunable YBCO Resonators on YIG Substrates" IEEE Transactions on Applied Superconductivity, vol. 7, No. 2, at 2338 (Jun. 1997).
G. Matthaei et al., "Microwave Filters, Impedance–Matching Network, and Coupling Structures", Chapter 16, Artech House, Dedham, MA (1980).
Kohjiro et al. "Numerical Characterization of Impedance Transformers Consisting of Vertically Stacked Superconducting Transmission Lines" IEEE Transactions on Applied Superconductivity, vol.7, No. 2, at 2343 (Jun. 1997).
Gao et al. "A Superconducting RF Three–Pole Filter in HF Range".
Gao et al. "A Superconducting RF Resonate in HF Range and its Multi–pole Filter Applications" IEEE Trans. On App. Superconductors, vol. 9, No. 2, P 3066 (Jun. 1999).

*Primary Examiner*—Long Pham
(74) *Attorney, Agent, or Firm*—Thomas T. Moga, Esq.; Powell, Goldstein, Frazer & Murphy LLP

(57) ABSTRACT

A method for fabricating a non-volatile memory on the semiconductor substrate is disclosed. First of all, a plurality of trench isolation regions are formed. Then, firstly implanting ions of a first conductivity type and second conductivity type are carried out. Secondly implanting ions of the first conductivity type and second conductivity type are carried out. Then, a first oxide layer is deposited and the first oxide layer is removed. A second oxide layer is deposited. A portion of second oxide is removed, thus, a portion of second oxide layer is remained. A third oxide layer is formed. A first polysilicon layer is formed. The first polysilicon layer is etched. A oxide-nitride-oxide layer is formed. Consequentially, the oxide-nitride-oxide layer are all etched. The second polysilicon on is formed. A portion of the second polysilicon layer, a portion of the first polysilicon layer, a portion of the third oxide layer and a portion of the second oxide layer are all etched. Thus, capacitor columns are formed.

20 Claims, 17 Drawing Sheets

METHOD FOR IMPLEMENTING NON-VOLATILE MEMORY ON A SEMICONDUCTOR SUBSTRATE

BACKGROUND OF THE INVENTION

1. Field of the Invention

The invention relates to implement a non-volatile memory on a semiconductor substrate, more particularly with an oxide-nitride-oxide layer structure.

2. Description of the Prior Art

Various nonvolatile memories have been disclosed in the prior art. Flash memory is one of the segments of nonvolatile memory devices. The device includes a floating gate to storage charges and an element for electrically placing charge on and removing the charges from the floating gate.

Normally, one of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. It is proposed another cell array for portable computing and telecommunications application.

In the flash array schematic, field oxides (FOX) are formed between cells such that a polysilicon extension on FOX of each cell provides adequate gate coupling ratio. In the article, the access time is one of the key concerns for low voltage read operation.

As FIG. 1A, shows that the shallow trench isolation 121 all are separated each other and there are an estimated cell region 151 and an estimated periphery region 150. Then, the first-type ion region 122 such as doping p-type well is formed into the semiconductor substrate 120. Also, this second ion normally is boron, and the first photoresist 160 is used as an implanting mask by the conventional photolithography.

As FIG. 1B, the second-type ion region 123 such as doping n-type well is formed into semiconductor substrate 120. Also, this first ion normally is phosphorus, and the second photoresist 161 is used as an implanting mask by the conventional photolithography.

As FIG. 1C, a first oxide layer such as silicon oxide layer is grown on the surface of semiconductor substrate 120. Then, this first oxide layer is removed. Again, the second oxide layer 126 that is the tunnel oxide layer is grown on the semiconductor substrate 120. A first polysilicon layer 127 is blankly and conformably deposited over the surface of the second oxide layer 126.

As FIG. 1D, portions of the first polysilicon layer 127 and the portions of the second oxide layer 126 both located on the periphery region 150 are etched using the dry etching. Also, the portions of the first polysilicon layer 127 and the portions of the second oxide layer 126 both located on the cell region 150 are remained.

As FIG. 1E, the third oxide layer 128 is blankly formed on the first polysilicon layer 127 using the low-pressure chemical vapor deposition (LPCVD). Then, the first nitride layer 129 is deposited on the surface of the third oxide layer 128 the low-pressure chemical vapor deposition (LPCVD). Again, the fourth oxide layer 130 is deposited on the surface of the first nitride layer 129 the low-pressure chemical vapor deposition (LPCVD). Thus, a sandwich-type Oxide 128-Nitride 129-Oxide 130 layer can be formed. The photoresist 160 is formed on the top surface of the semiconductor as the implanting mask. Then, the first-type ion region 124 such as doping p-type well is formed into the semiconductor substrate 120. Also, this first ion normally is B, and the Oxide 128-Nitride 129-Oxide 130 dielectric layer is used as an implanting screen oxide by the conventional photolithography.

As FIG. 1F, the second-type ion region 125 such as doping n-type well is formed into semiconductor substrate 120. Also, this first ion normally is phosphrous or arsemic, and the Oxide 128-Nitride 129-Oxide 130 dielectric layer is used as an implanting screen oxide by the conventional photolithography.

As FIG. 1G, portions of the oxide 128-nitride 129-oxide 130 dielectric layer located on the periphery region 150 are etched using the conventional photolithography. Also, the other portions of the oxide 128-nitride 129-oxide 130 dielectric layer are still remained on the cell region 151.

As FIG. 1H, a fifth oxide layer 131 is grown over the periphery region 150 located on the surface of semiconductor substrate 120.

As FIG. 1I, the portions of the fifth oxide layer 131 located on the shallow trench isolation 121 of the periphery region 150, the fifth oxide layer 131 located on the second type ion region 125 and the first ion region 124 are all etched using the conventional dry etching. Thus, the other portions of the fifth oxide layer 131 located on the second type ion region 123 and the first ion region 122 are still remained.

As FIG. 1J, a sixth oxide layer 132 is grown over the surface of the semiconductor substrate 120, the second ion region 123 and the first ion region 122 using the furnace.

As FIG. 1K, a second polysilicon layer 133 is deposited on the surface of oxide layer 132 and the surface of the fourth oxide layer 130.

As FIG. 1L, the portions of the second polysilicon layer 133 is etched using the dry etching until the shallow trench isolation 121 is exposed. The other portions of the second polysilicon layer are still remained on the surface of the first-type ion region 122, the second-type ion region 123, the first-type ion region 124 and the second-type ion region 125 that are all located on the periphery region 151, and still remained on the surface of the oxide 128-nitride 129-oxide 130 dielectric layer that are located on the cell region 151. Thus, the capacitor column are formed.

According to the prior art, it can not be used as a higher voltage cell. Also, some of fabrication steps such as photomask step and furnace step are extra for the whole manufacture process. The loss of oxide are still high.

SUMMARY OF THE INVENTION

In accordance with the present invention, a method is provided for forming an implement non-volatile memory that substantially reduces the loss of oxide.

According to the preferred embodiment of this present invention, it can be used as a 3.3 voltage cell.

Also, some of fabrication steps such as photo-mask step and furnace step can be reduced for the whole manufacture process. The good quality for Sandwich-like type, such as Oxide-Nitride-Oxide layer can be obtained.

Therefore, in one embodiment, according to the above description, a plurality of trench isolation regions are formed in the semiconductor substrate. The isolation regions is separated from each other by an active region, wherein some of the active regions are located in a cell region of the semiconductor substrate, and the other of the active regions are located in a periphery region of the semiconductor substrate.

Then, firstly implanting ions of a first conductivity type into the active regions of the semiconductor substrate with a first voltage is carried out. Thus, a first ion region of the first conductivity type is formed, wherein the firstly implanting step is performed by using a first photoresist layer as mask. Next, the first photoresist removed. Again, firstly implanting ions of a second conductivity type into the active regions of the semiconductor substrate with a first voltage is carried out. Thus, a first ion region of the second conductivity type is formed, wherein the firstly implanting step is performed by using a second photoresist layer as mask, which is configures to make the first ion region of the second conductivity type be neighboring to the first ion region of the first conductivity type. Next, the second photoresist is removed.

Secondly implanting ions of the first conductivity type into the active regions of the semiconductor substrate with a second voltage is carried out. Thus, a second ion region of the first conductivity type is formed, wherein the secondly implanting step is performed by using a third photoresist layer as mask, which are configures to make the second ion region of the first conductivity type be neighboring to the first ion region of the second conductivity type. Then, the third photoresist is removed. Again, secondly implanting ions of the second conductivity type into the active regions of the semiconductor substrate with a second voltage is carried out. Thus, a second ion region of the second conductivity type is formed, wherein the secondly implanting step is performed by using a fourth photoresist layer as mask, which are configures to make the second ion region of the second conductivity type be neighboring to the second ion region of the first conductivity type. Then, the fourth photoresist is removed.

Then, a first oxide layer is deposited on the semiconductor substrate. The first oxide layer is removed. A second oxide layer is deposited on the semiconductor substrate. A portion of second oxide is removed, wherein fifth photoresist is used as an etching mask over first-type ion region on periphery region by first voltage implanting and the second-type region on periphery region by the first voltage implanting. Thus, a portion of second oxide layer is remained on and over the surface of first-type ion region and second-type ion region that are both formed by the first voltage implanting. The fifth photoresist is removed. A third oxide layer is formed on the second silicon dioxide layer and semiconductor substrate. A first polysilicon layer is blanket and conformably formed on the third oxide layer. A sixth photoresist is formed on first polysilicon layer to define an opening in the first polysilicon layer, wherein the opening is located between the periphery region and the cell region. The first polysilicon layer is etched until the trench isolation region is exposed, so that opening is formed and the sixth photoresist is used as an etching mask. The sixth photoresist is removed. A fourth oxide layer is formed over first polysilicon layer and the opening. Next, a first nitride layer is formed over the fourth oxide layer. Then, a fifth oxide layer is formed over the first nitride layer. A seventh photoresist is formed over the fifth oxide layer located on cell region to expose the periphery region.

Consequentially, the fourth oxide layer, the second nitride layer and the fifth oxide layer located on periphery region are all etched until the surface of the trench isolations located under the opening being exposed, wherein the seventh photoresist is used as an etching mask for leaving portions of the fourth oxide layer, the second nitride layer and the fifth oxide layer located on the periphery region. The second polysilicon on is formed the first polysilicon located on the periphery region and on the third oxide layer located on the cell region. A eighth photoresist is formed on the active region of the second conductive layer, wherein the active regions being on the first ion region of the first conductivity type and the first ion region of the second conductivity type.

A portion of the second polysilicon layer, a portion of the first polysilicon layer, a portion of the third oxide layer and a portion of the second oxide layer are all etched until the surface of trench isolation is exposed. Thus, capacitor columns are formed, some of the capacitor columns include the second polysilicon layer, the first polysilicon layer and the third oxide layer located on the periphery region. Some of the capacitor columns include the second polysilicon layer, the first polysilicon layer, the third oxide layer and the second oxide layer on the periphery region. The other of capacitor columns include the second polysilicon layer, the fourth oxide layer, the first nitride layer, the fifth oxide layer, the first polysilicon layer and the third oxide layer on the cell region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to flash, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Figure 1A:
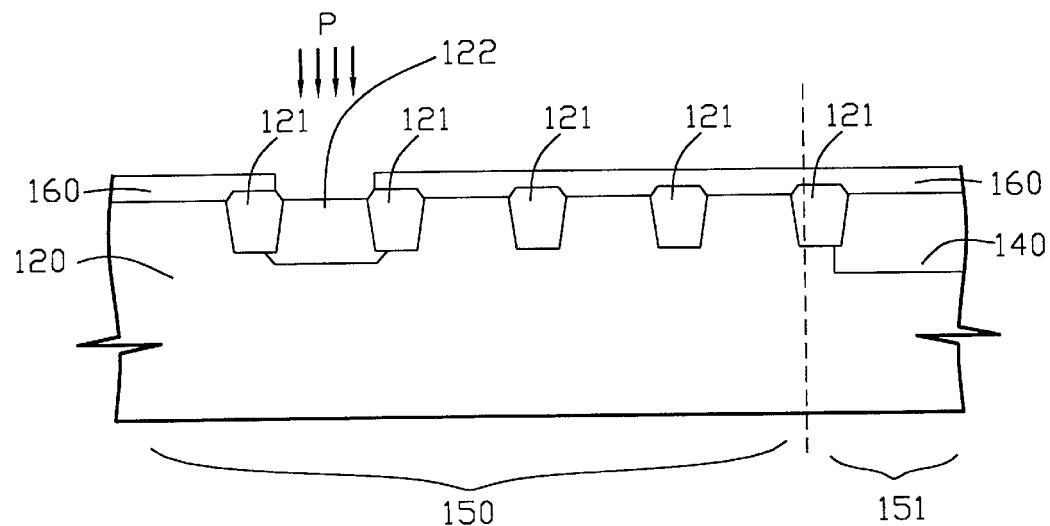
FIGS. 1A to 1L is a circuit diagram schematically illustrating the prior art.
Figure 1B:
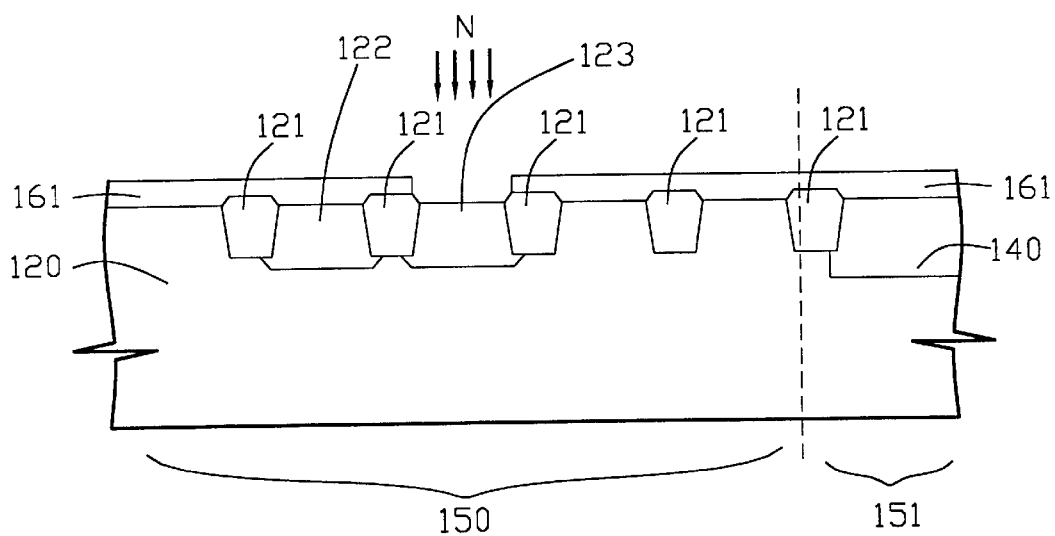
Figure 1C:
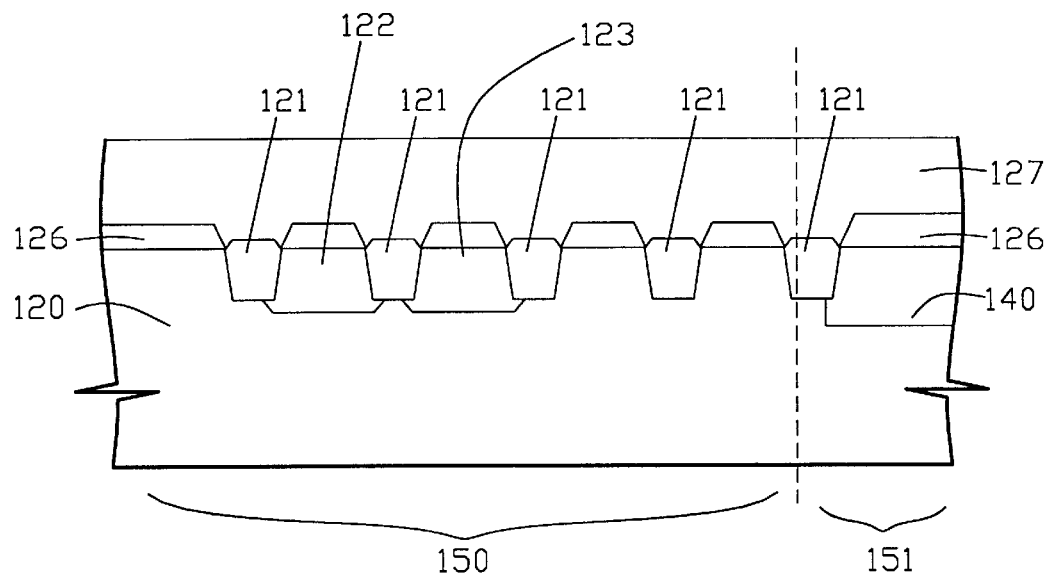
Figure 1D:
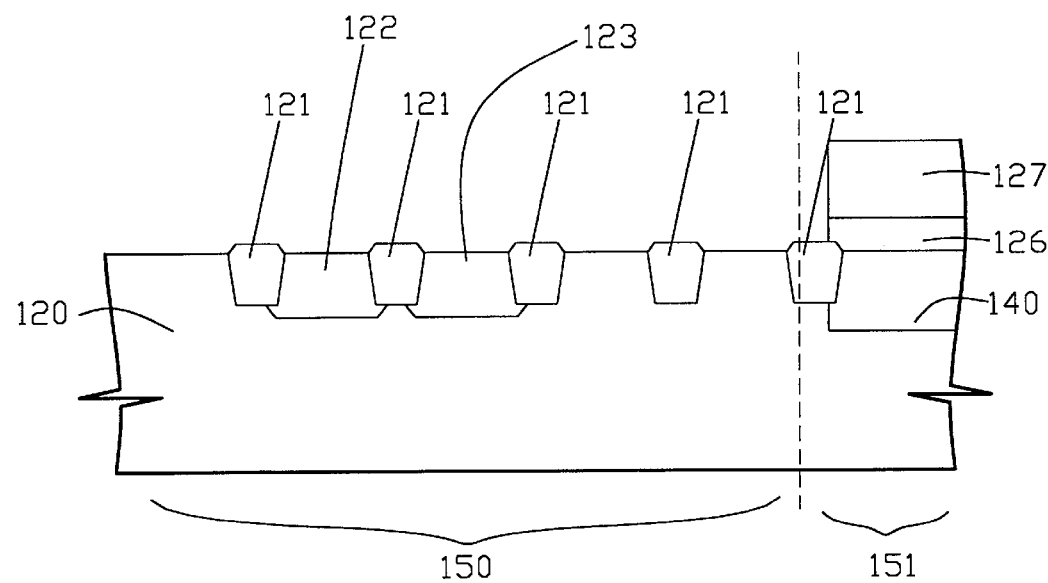
Figure 1E:
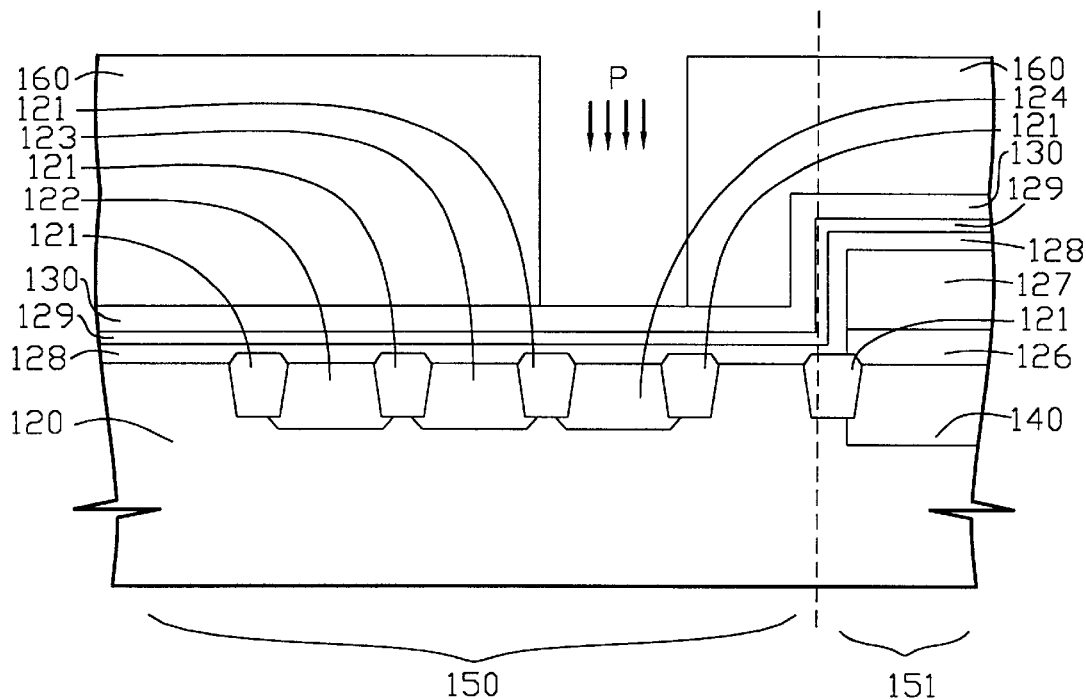
Figure 1F:
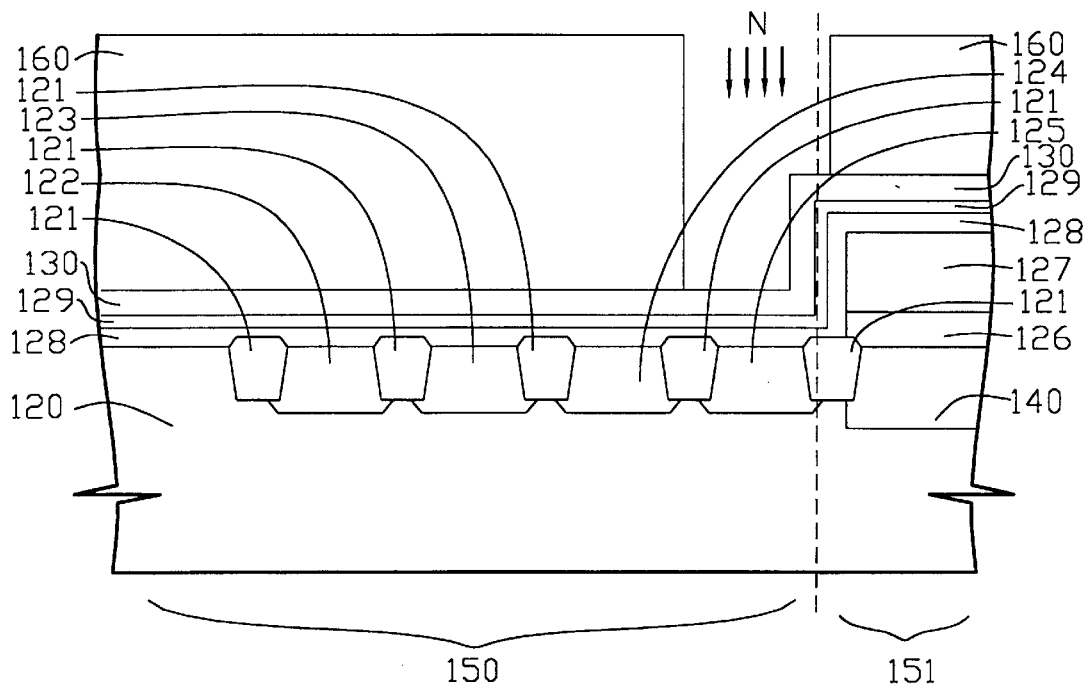
Figure 1G:
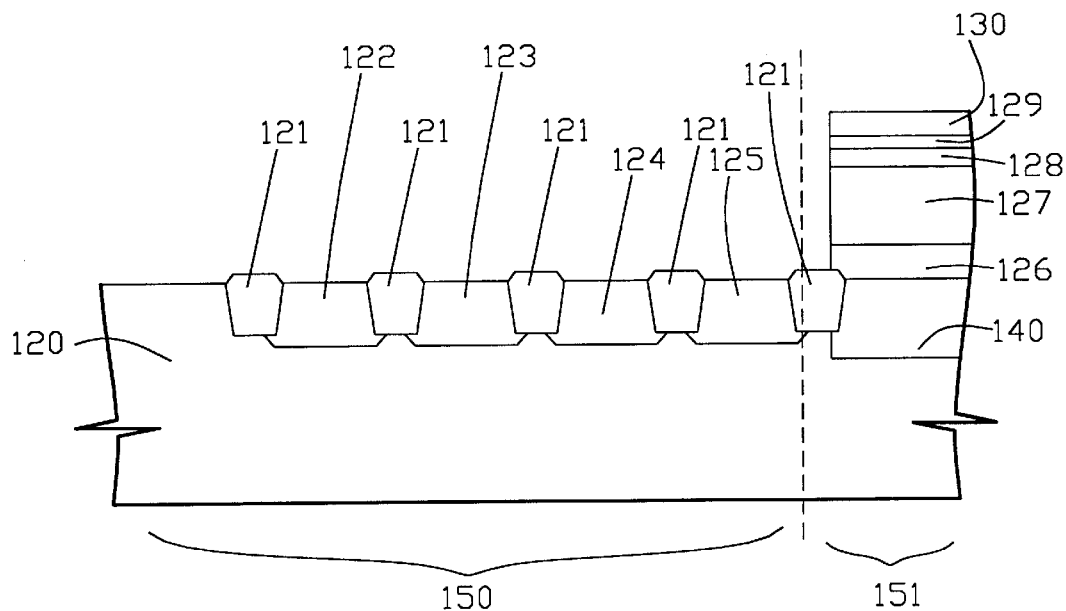
Figure 1H:
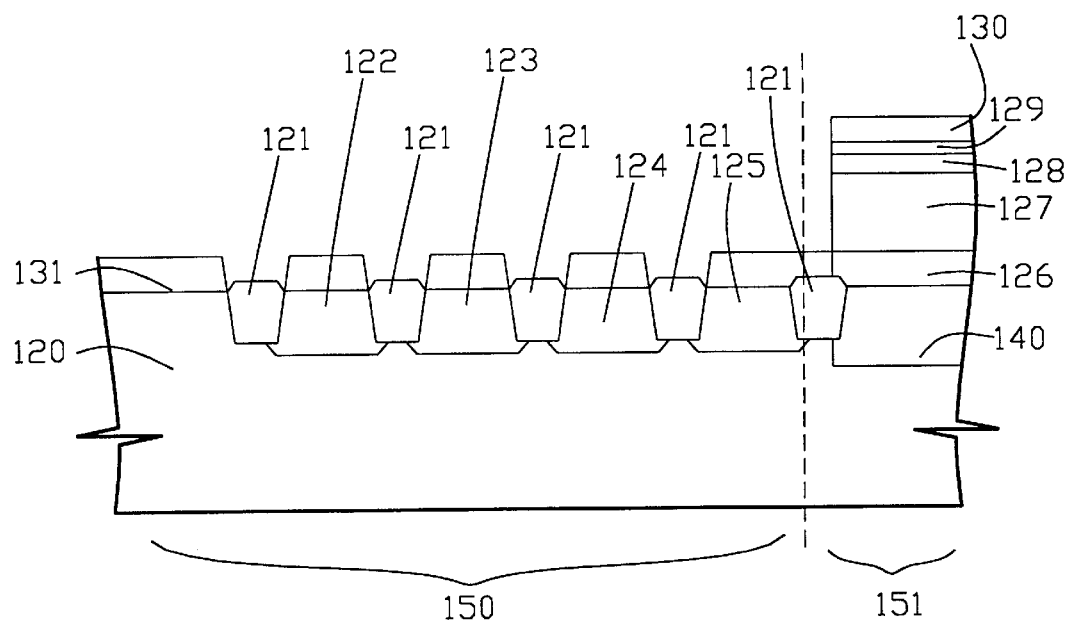
Figure 1I:
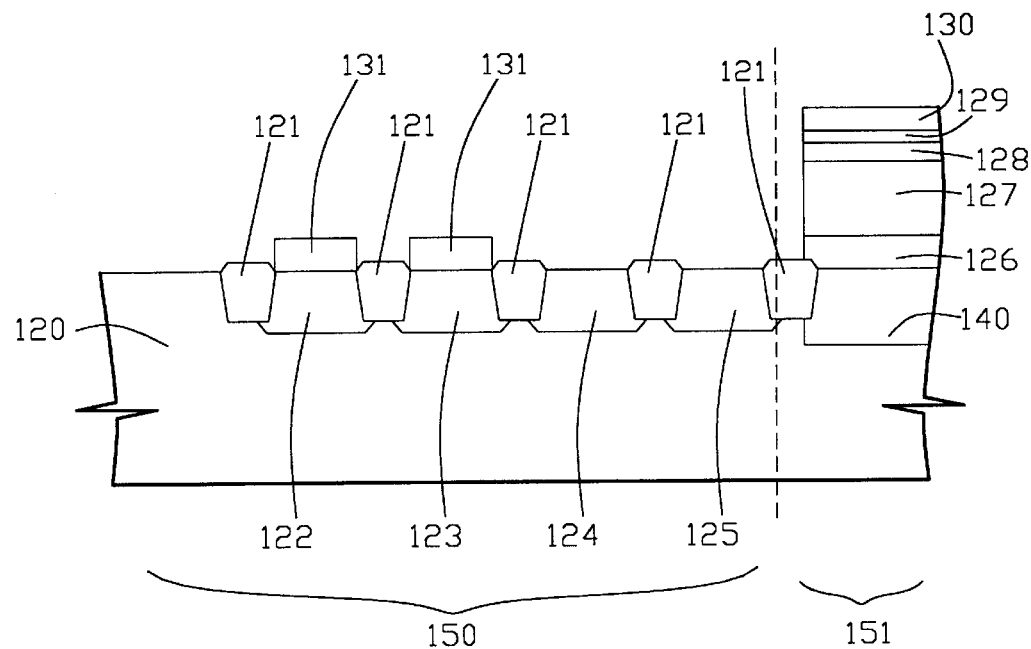
Figure 1J:
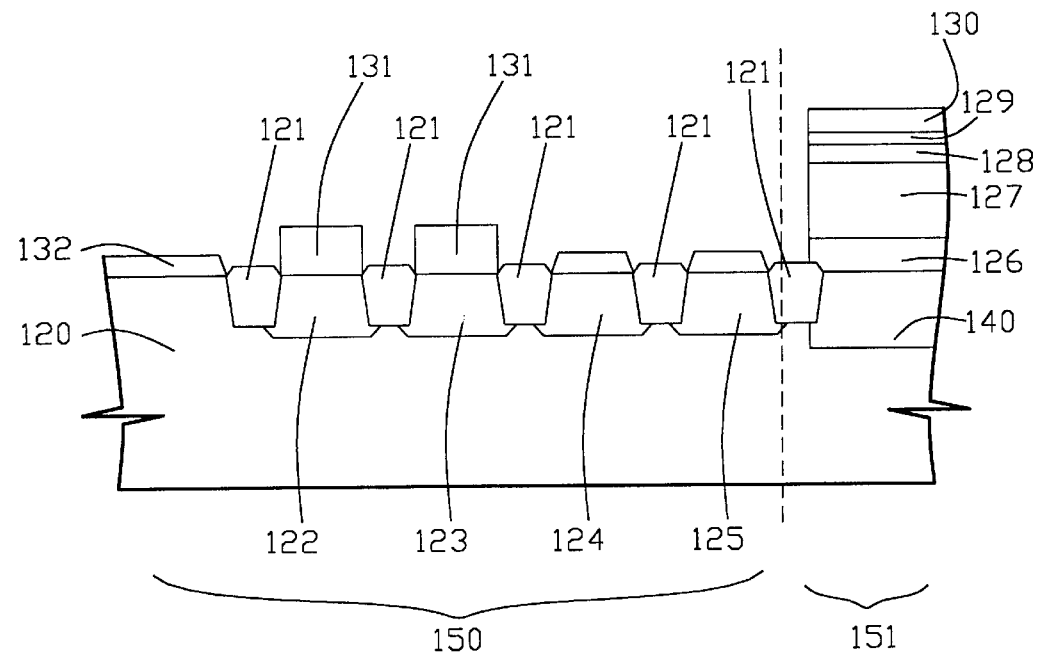
Figure 1K:
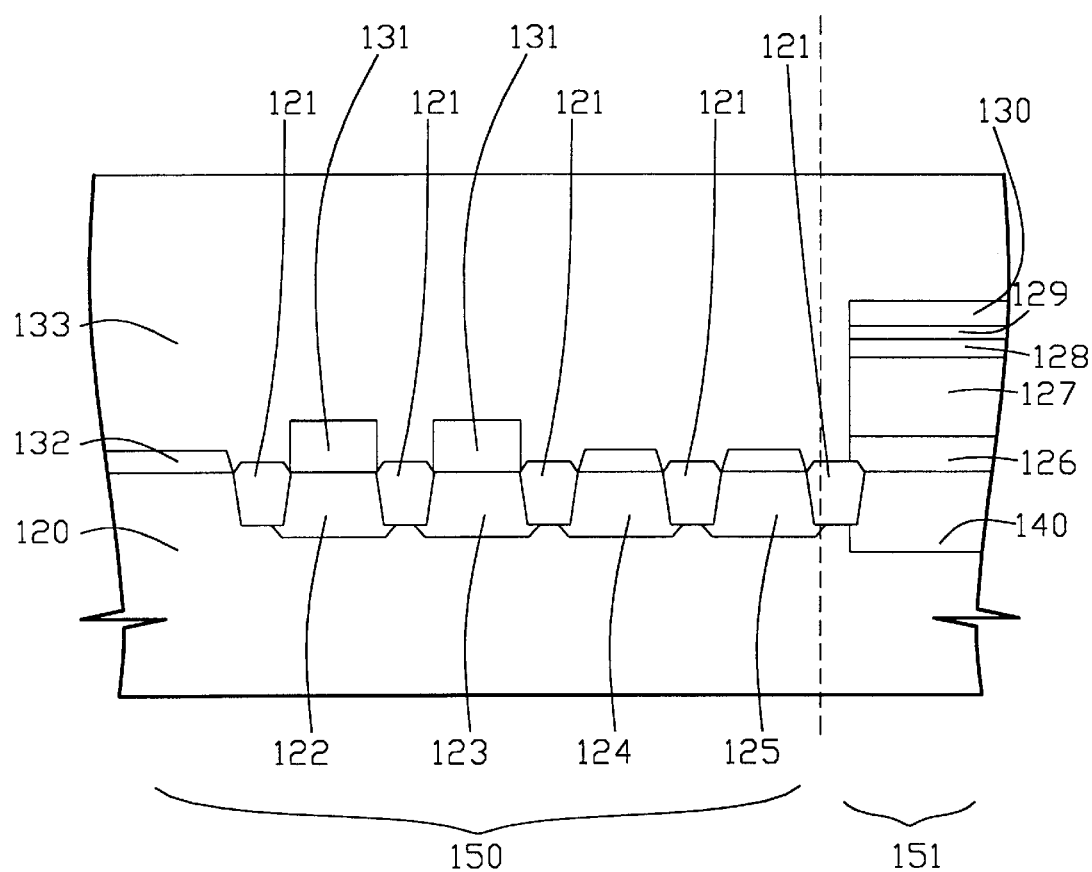
Figure 1L:
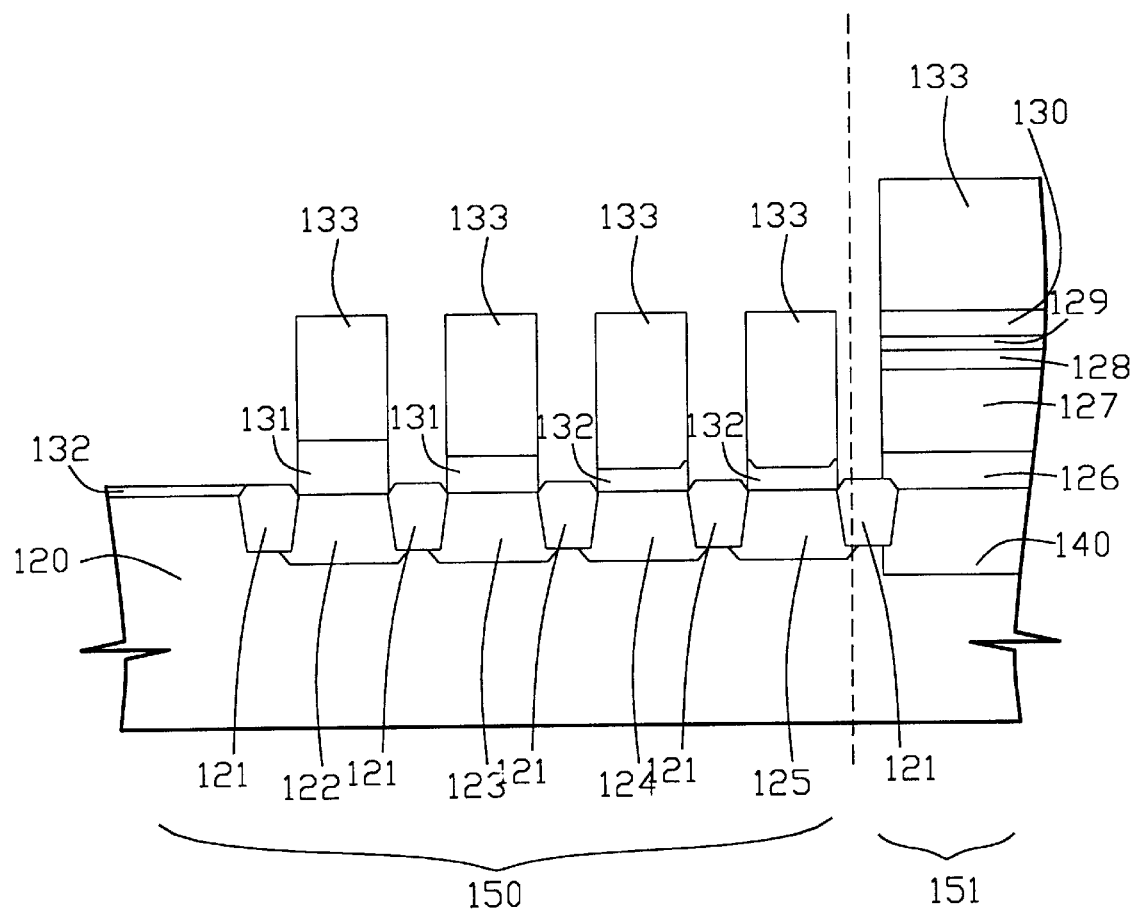
Figure 2A:
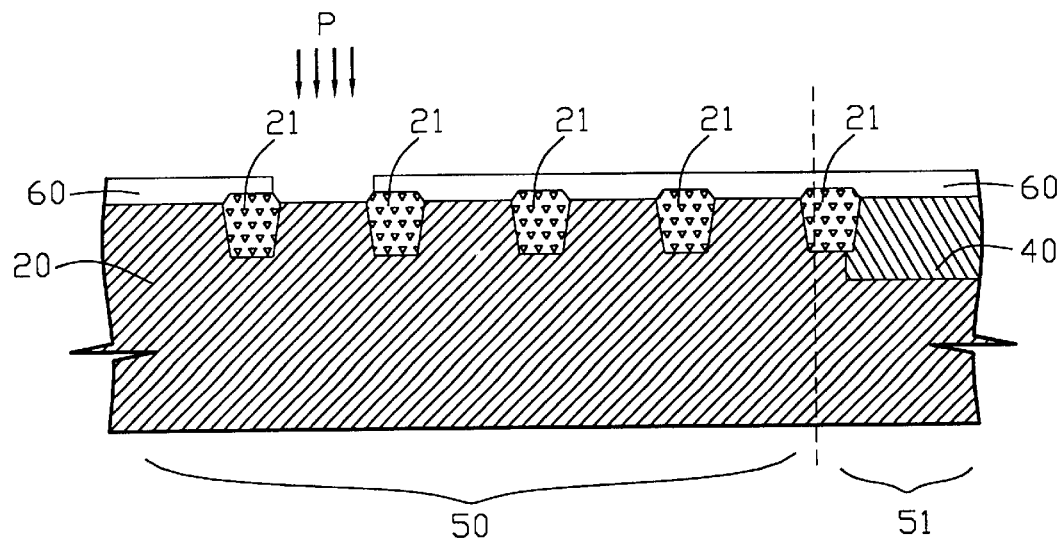
FIGS. 2A to 2R are illustrative of various components in the structure of the present invention.
Figure 2B:
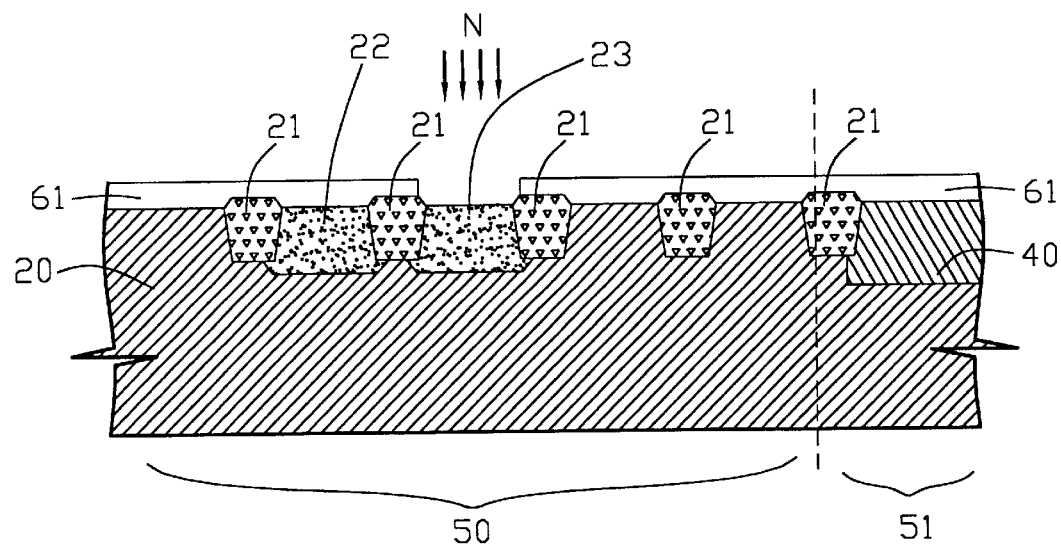
Figure 2C:
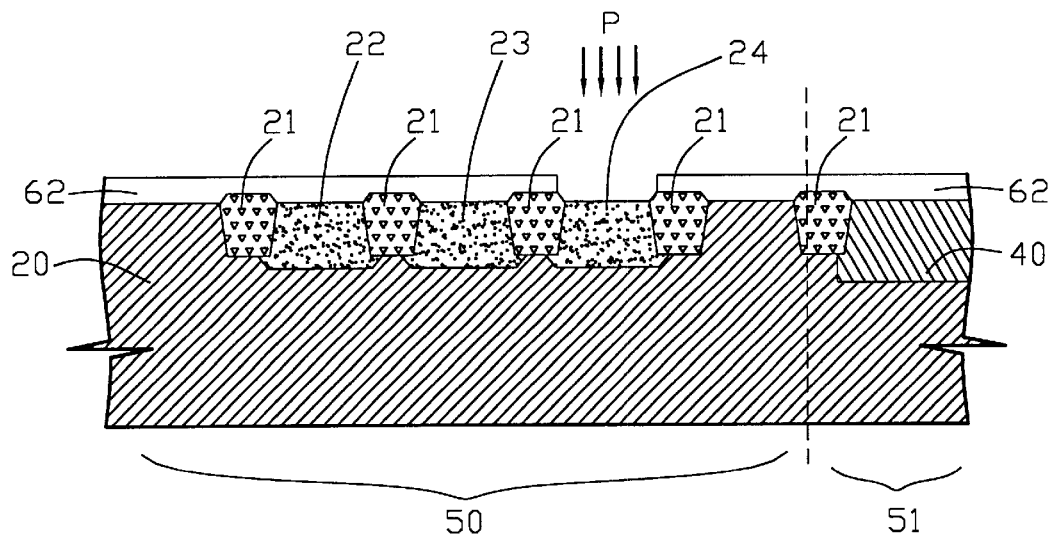
Figure 2D:
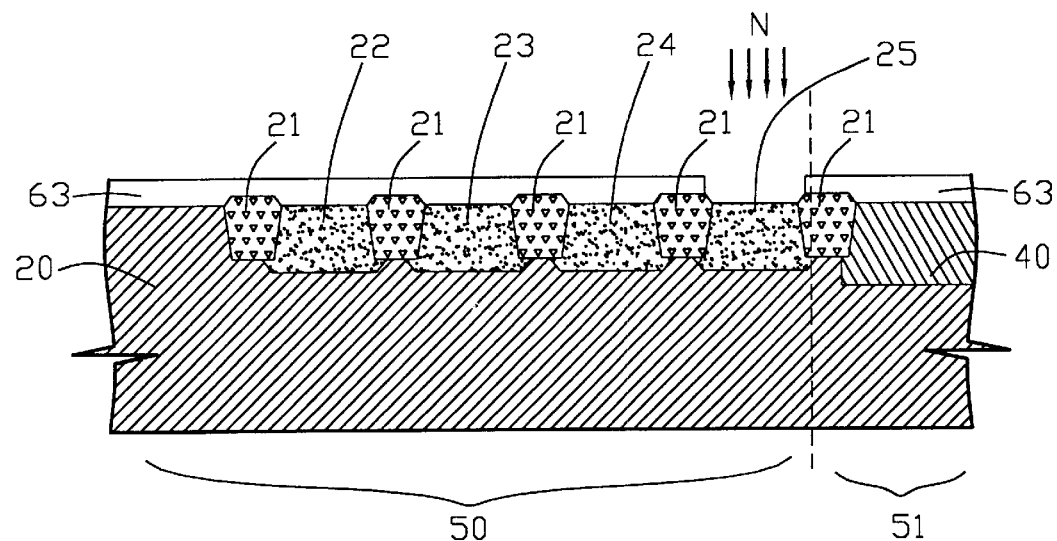
Figure 2E:
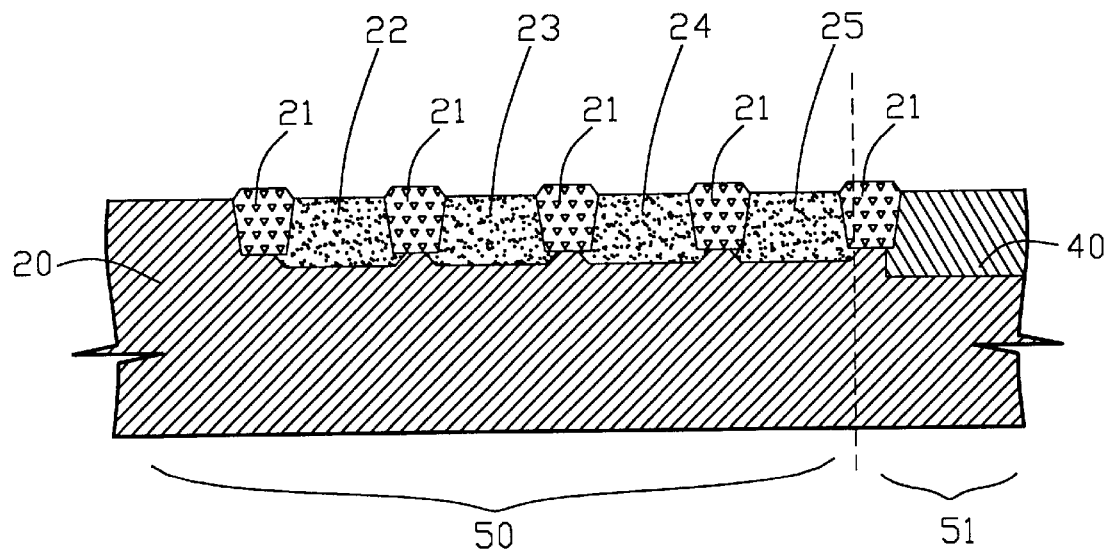
Figure 2F:
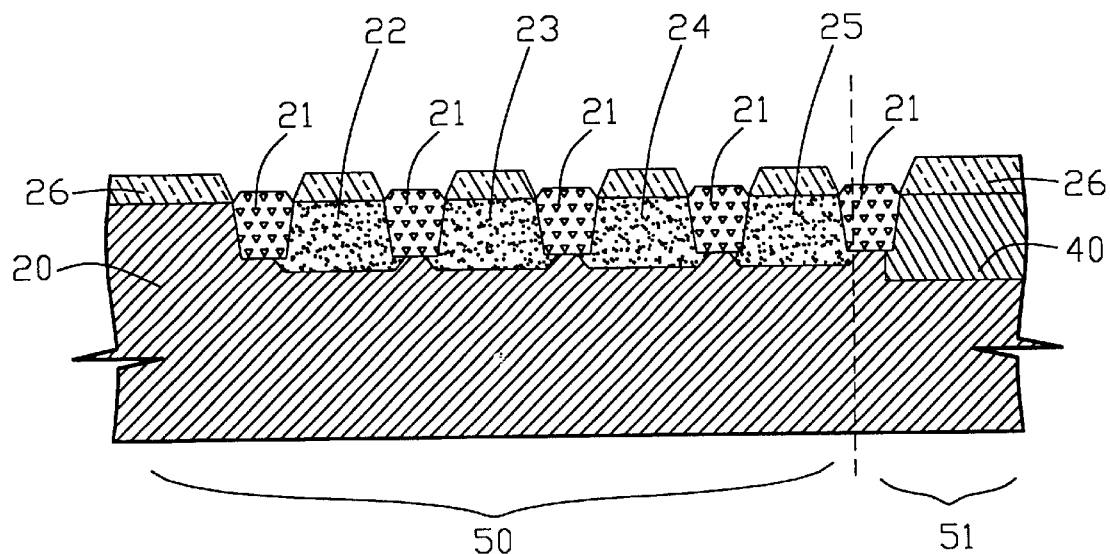
Figure 2G:
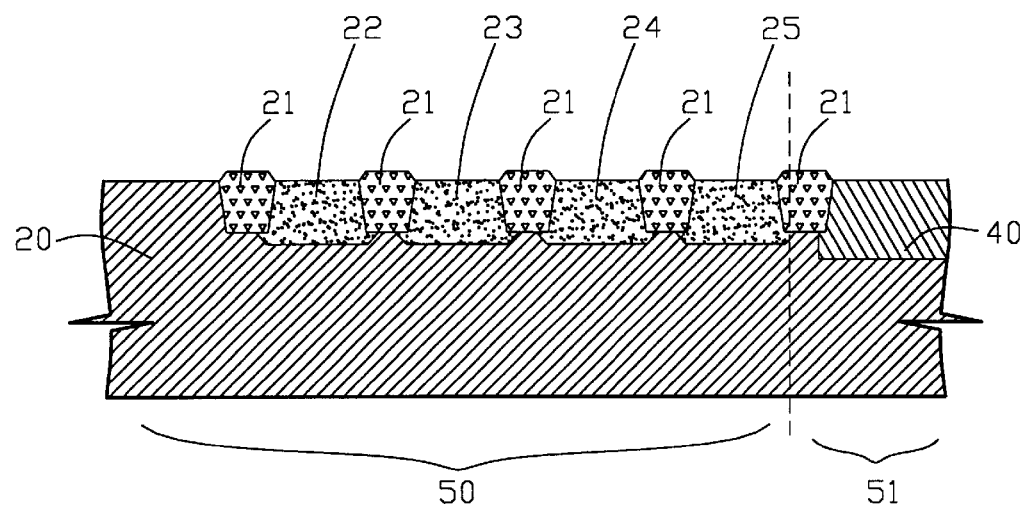
Figure 2H:
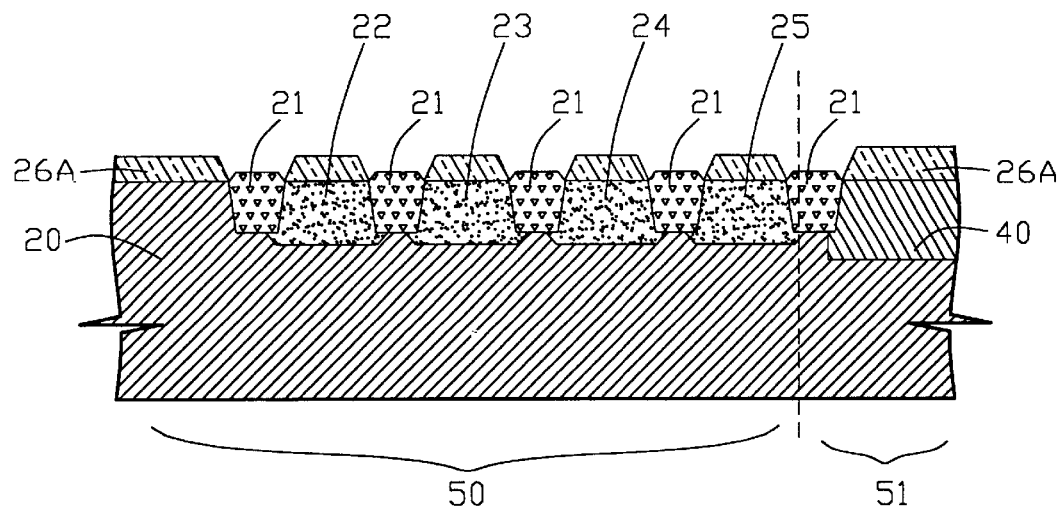
Figure 2I:
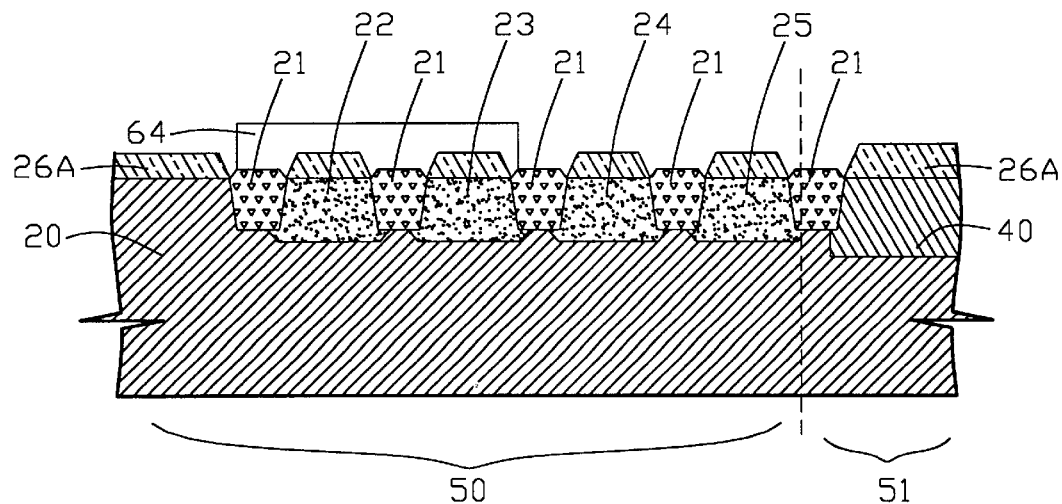
Figure 2J:
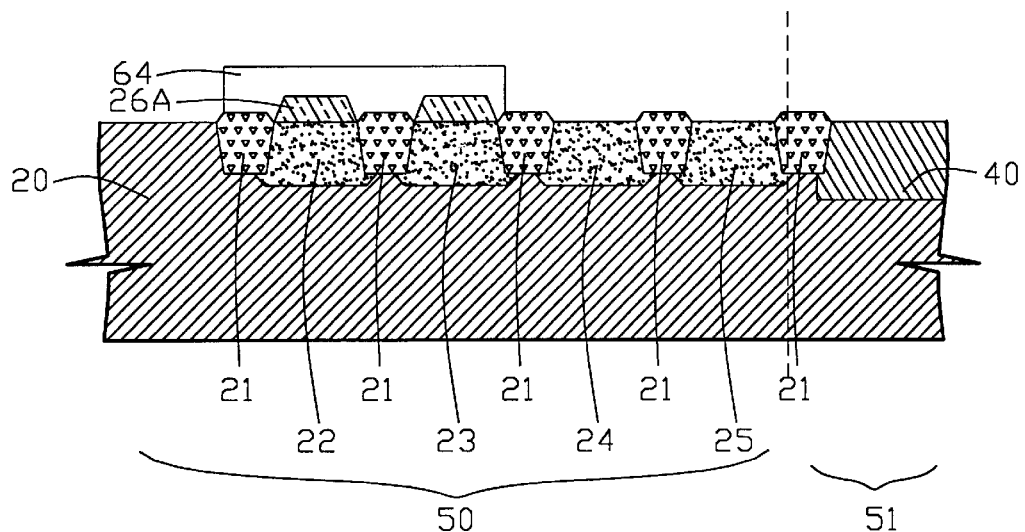
Figure 2K:
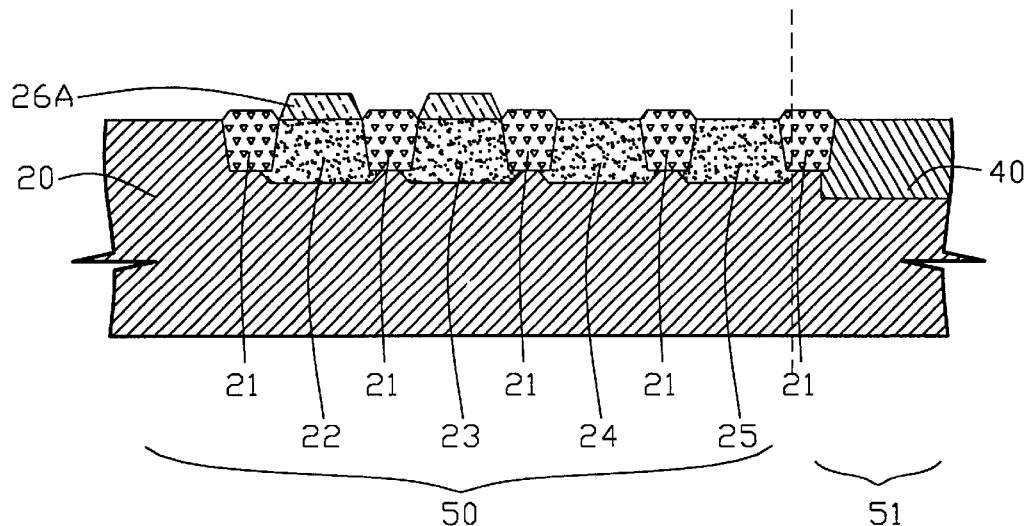
Figure 2L:
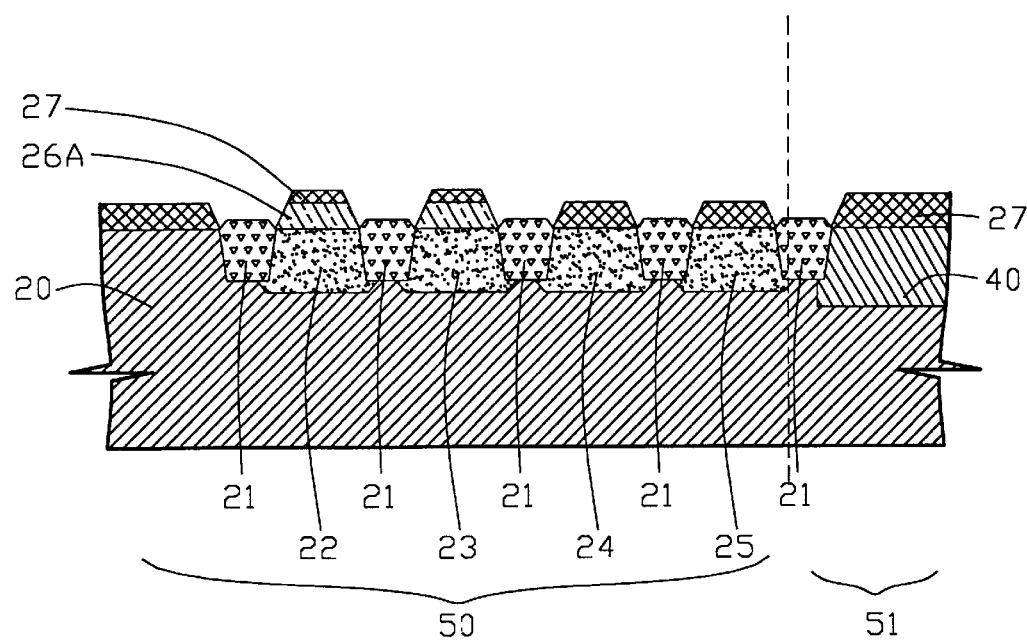
Figure 2M:
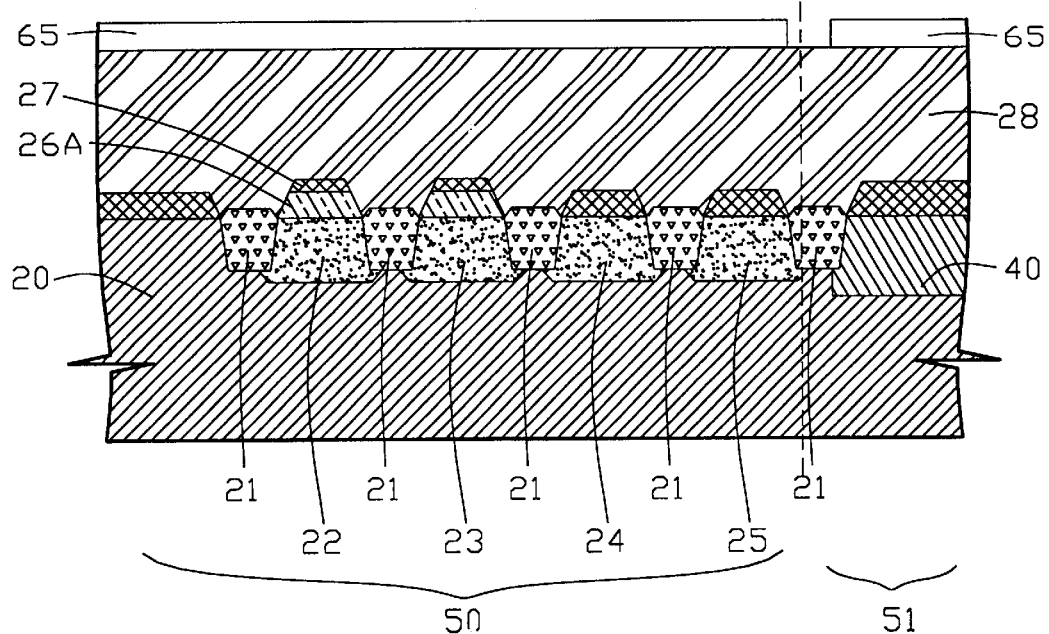
Figure 2N:
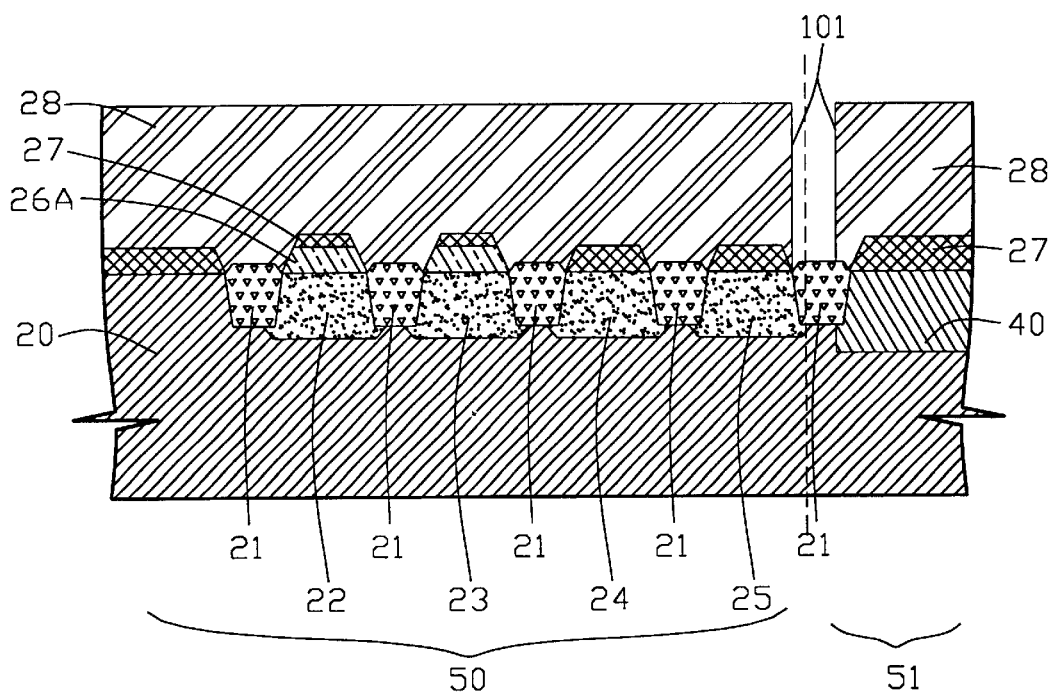
Figure 2O:
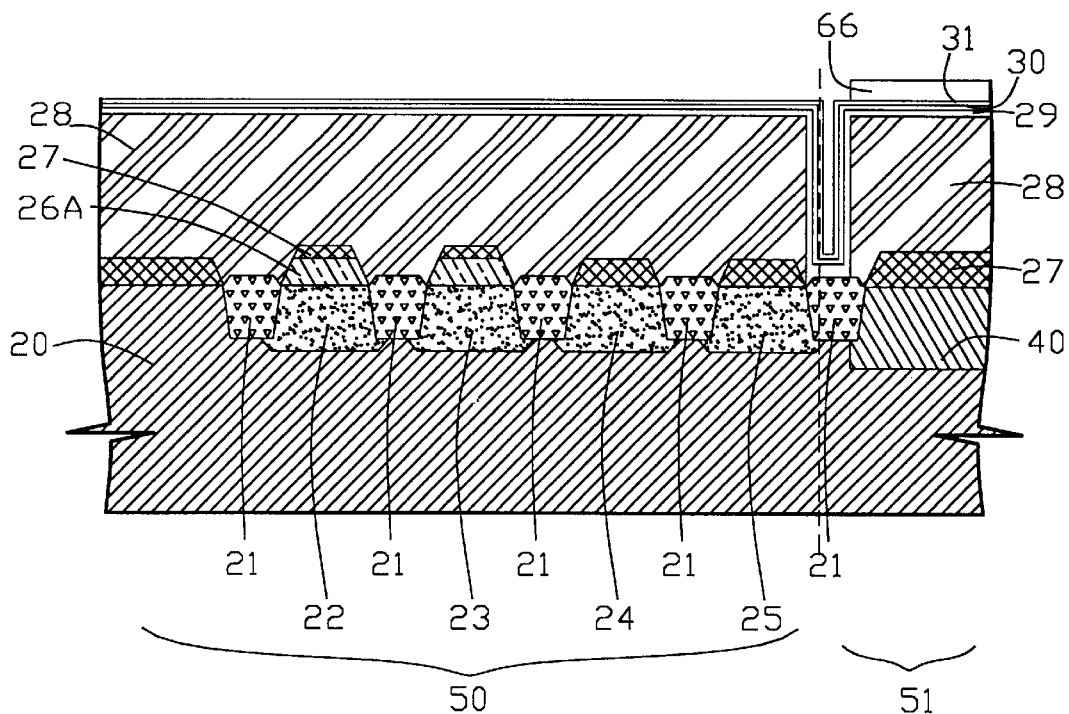
Figure 2P:
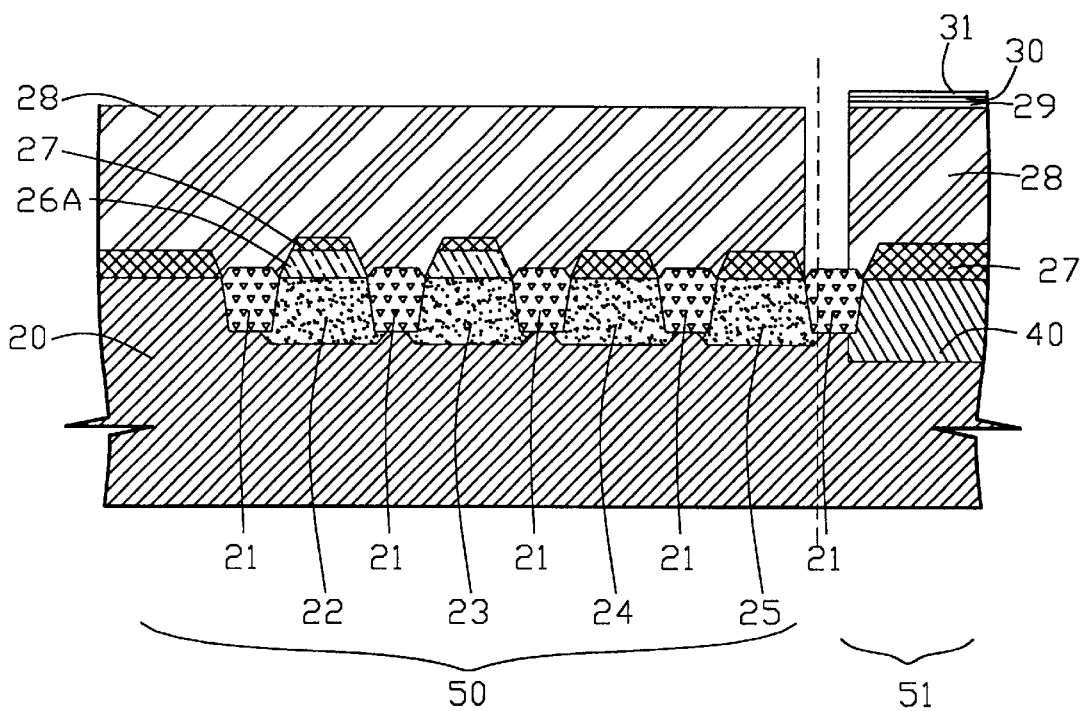
Figure 2Q:
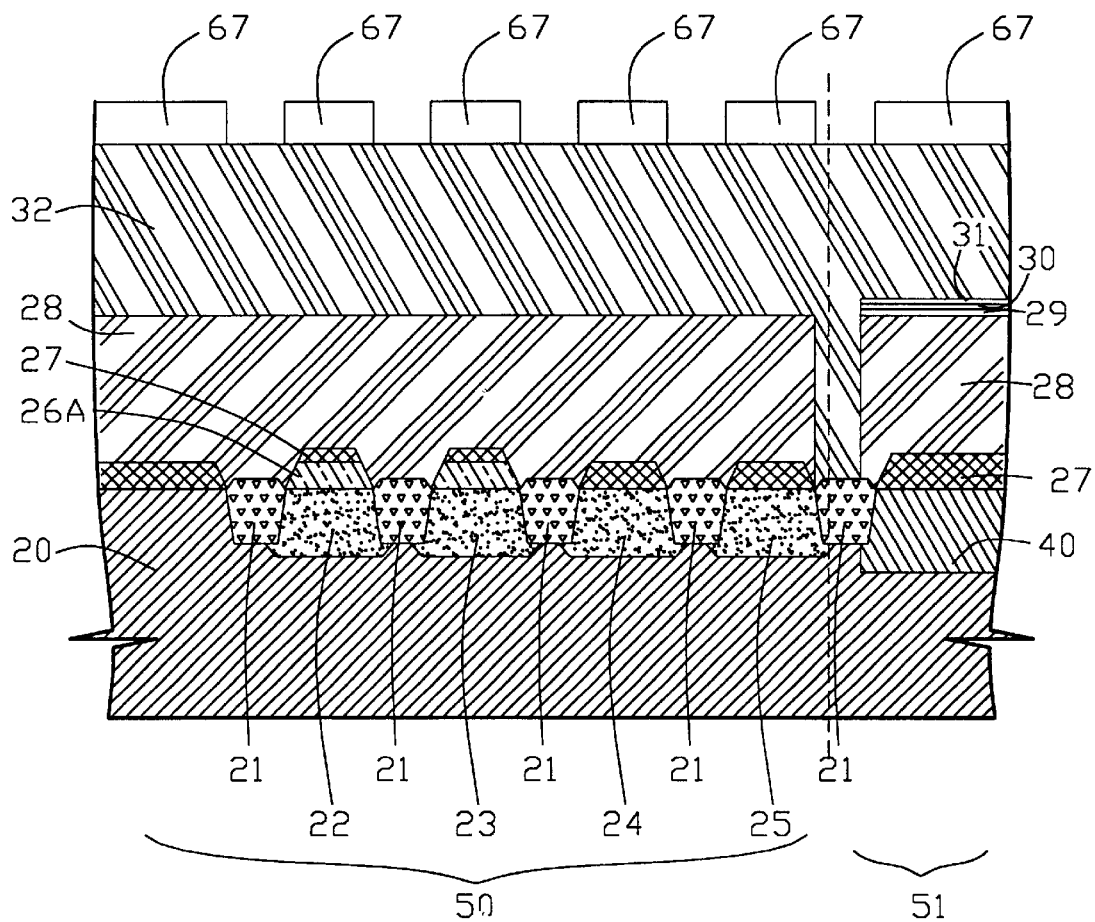
Figure 2R:
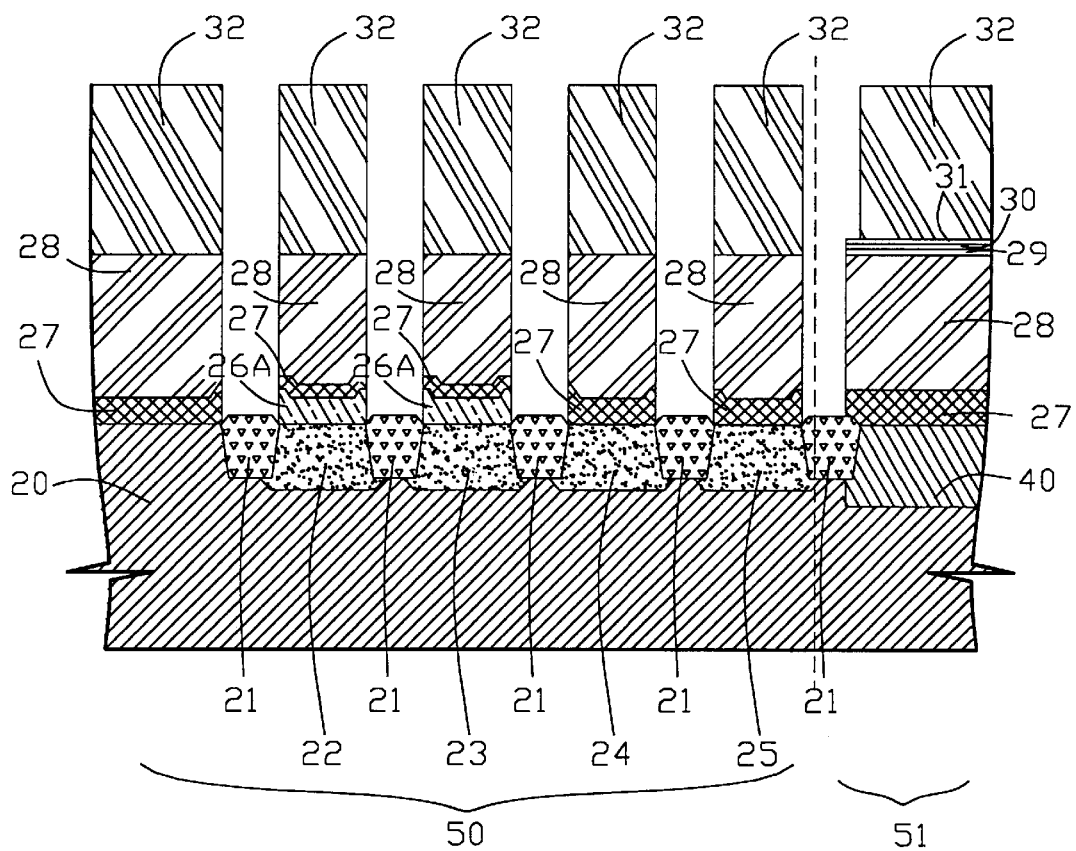

The spirit of the proposed invention can be explained and understood by the following embodiments with corresponding figures from FIGS. 2A to 2R.

FIG. 2A shows that a plurality of trench isolation regions 21 are formed in the semiconductor substrate 20. The isolation regions 21 is separated from each other by an active region, wherein some of the active regions are located in a cell region 51 of the semiconductor substrate 20, and the other of the active regions are located in a periphery region 50 of the semiconductor substrate 20.

Then, firstly implanting ions of a first conductivity type into the active regions of the semiconductor substrate 20 with a first voltage is carried out. Thus, a first ion region of the first conductivity type 22 such as p-type well is formed, the firstly implanting step is performed by using a first photoresist 60 layer as a mask and this implanting ions of the first conductivity type normally are boron. The first photoresist 60 can be removed using the conventional process steps.

With reference to FIG. 2B, firstly implanting ions of a second conductivity type into the active regions of the semiconductor substrate 20. Thus, a first ion region of the second conductivity type 23 such as n-type well is formed, wherein the firstly implanting step is performed by using a second photoresist layer 61 as a mask. The first conductivity type is opposite to the second conductivity type. The second photoresist 61 can be removed using the conventional process steps.

Again, referring to FIG. 2C, secondly implanting ions of the first conductivity type 24 into the active regions of the semiconductor substrate 20. Thus, a second ion region of the first conductivity type such as p-type well is formed, wherein the secondly implanting step is performed by using a third photoresist layer 62 as a mask. The third photoresist 62 can be removed using the conventional proces steps.

As FIG. 2D, secondly implanting ions of the second conductivity type into the active regions of the semiconductor substrate 20 with a second voltage is carried out. Thus, a second ion region of the second conductivity type 25 such as n-type well is formed, wherein the secondly implanting step is performed by using a fourth photoresist layer 63 as mask.

As FIG. 2E, the fourth photoresist 63 is removed by using the conventional process steps.

Sequentially as FIG. 2F, the first oxide layer such as the silicon dioxide is grown by the furnace as the first gate oxide layer 26 on the semiconductor substrate 20.

The first gate oxide layer 26 is removed using the conventional etching process steps illustrated as FIG. 2G.

Again, as FIG. 2H, the second oxide layer such as the silicon dioxide is grown as the first gate oxide layer 26A on semiconductor substrate 20. The thickness of gate oxide is about 200 angstroms to 300 angstroms and is formed using the furnace growth.

As FIG. 2I, by using the conventional photolithography, the fifth photoresist 64 is formed over the first ion region of the first conductivity type 22 and the first ion region of the second conductivity type 23 by the first voltage implanting, that are all on the periphery region 50.

As FIG. 2J, a portion of second oxide 26A is removed by using the conventional etching method such as plasma etching and the wet HF solution, the fifth photoresist 64 is used as an etching mask. Then a portion of the second oxide layer 26A is remained on and over the surface of the first ion region of the first conductivity type 22 and the first ion region of the second conductivity type 23 that are formed.

FIG. 2K, the fifth photoresist 64 is removed by using the conventional process steps.

FIG. 2L, the third oxide layer such as the silicon dioxide layer 27 is formed on the remained second silicon dioxide layer 26 and the semiconductor substrate 20.

FIG. 2M, the first polysilicon layer 28 is blankly formed on the third oxide layer 27. The thickness of first polysilicon layer 28 is about 800 angstroms to 1000 angstroms and is formed using the low-pressure chemical vapor deposition (LPCVD). Then sixth photoresist 65 is formed on the first polysilicon layer 26 to define an opening. This photo defines the cell floating gate pattern.

As FIG. 2N, the first polysilicon layer 28 is etched until shallow trench isolation region 21 is exposed using the conventional dry plasma etching. Opening 101 can be formed and sixth photoresist 65 is used as an etching mask. Then sixth photoresist 65 is removed by using the conventional photolithography.

As FIG. 2O, the fourth oxide layer such as the silicon dioxide layer 29 is formed over the first polysilicon layer 28 and opening 101 using LPCVD. The thickness of the silicon dioxide layer 29 is about 70 angstroms to 200 angstroms. Again, the first nitride layer such as the silicon nitride layer 30 is formed over the fourth oxide layer 29 using LPCVD. The thickness of the silicon nitride 30 is about 70 angstroms to 200 angstroms. Then, the fifth oxide layer such as the silicon dioxide layer 31 is formed over the first oxide layer 30 using LPCVD. The thickness of the silicon dioxide layer 29 is about 70 angstroms to 200 angstroms. The seventh photoresist 66 is formed over the fifth oxide layer 31 that is on the cell region 51, especially the periphery region 50 is exposed by this photoresist 66.

As FIG. 2P, the fourth oxide layer 29, the second nitride layer 30 and the fifth oxide layer 31 located on the periphery region 50 are all etched until the surface of the shallow trench isolation 21 located under the opening 101 is exposed using the conventional dry plasma etching. The seventh photoresist 66 is used as an etching mask for remaining portions of the fourth oxide layer 29, the second nitride layer 30 and the fifth oxide layer 31 located on the periphery region 50.

As FIG. 2Q, the second polysilicon 32 is formed on first polysilicon 28 located on periphery 50 and on fourth oxide layer 29 located on cell region 51. Eighth photoresist 67 is formed on the active region of second polysilicon 32 using the conventional photolithography, especially the active regions are on p-type well region and n-type well region.

Finally, by using the conventional dry plasma etching, a portion of the second polysilicon layer 32, a portion of the first polysilicon layer 28, a portion of the third oxide layer 27 and a portion of the second oxide layer 26A are all etched until the surface of shallow trench isolation 21 is exposed as FIG. 2R. The capacitor columns are therefore formed by using eighth photoresist 67 as an etching mask. Thus, parts of the capacitor columns will conclude the second polysilicon layer 32, the first polysilicon layer 28 and the third oxide layer 27 located on the periphery region 50. Another parts of capacitor columns conclude the second polysilicon layer 32, the first polysilicon layer 28, the third oxide layer 27 and the second oxide layer 26A on the periphery region 50. And, other parts of capacitor columns conclude the second polysilicon layer 32, the fifthth oxide layer 31, the first nitride layer 30, the fourth oxide layer 29, the first polysilicon layer 28 and the third oxide layer 27 on the cell region 50.

According to the preferred embodiment of this present invention, it can be used as a 3.3 voltage cell. Also, some of fabrication steps such as photo-mask step and furnace step can be reduced for the whole manufacture process. The good quality for Sandwich-like type, such as Oxide-Nitride-Oxide layer can be obtained. The loss of oxide can be improved.

Therefore, according to the above description, a plurality of trench isolation regions are formed in the semiconductor substrate. The isolation regions is separated from each other by an active region, wherein some of the active regions are located in a cell region of the semiconductor substrate, and the other of the active regions are located in a periphery region of the semiconductor substrate.

Then, firstly implanting ions of a first conductivity type into the active regions of the semiconductor substrate with a first voltage is carried out. Thus, a first ion region of the first conductivity type is formed, wherein the firstly implanting step is performed by using a first photoresist layer as mask. Next, the first photoresist removed. Again, firstly implanting ions of a second conductivity type into the active regions of the semiconductor substrate with a first voltage is carried out. Thus, a first ion region of the second conductivity type is formed, wherein the firstly implanting step is performed by using a second photoresist layer as mask, which is configures to make the first ion region of the second conductivity type be neighboring to the first ion region of the first conductivity type. Next, the second photoresist is removed.

Secondly implanting ions of the first conductivity type into the active regions of the semiconductor substrate with a second voltage is carried out. Thus, a second ion region of the first conductivity type is formed, wherein the secondly implanting step is performed by using a third photoresist layer as mask, which are configures to make the second ion region of the first conductivity type be neighboring to the first ion region of the second conductivity type. Then, the third photoresist is removed. Again, secondly implanting ions of the second conductivity type into the active regions of the semiconductor substrate with a second voltage is carried out. Thus, a second ion region of the second conductivity type is formed, wherein the secondly implanting step is performed by using a fourth photoresist layer as mask, which are configures to make the second ion region of the second conductivity type be neighboring to the second ion region of the first conductivity type. Then, the fourth photoresist is removed.

Then, a first oxide layer is deposited on the semiconductor substrate. The first oxide layer is removed. A second oxide layer is deposited on the semiconductor substrate. A portion of second oxide is removed, wherein fifth photoresist is used as an etching mask over first-type ion region on periphery region by first voltage implanting and the second-type region on periphery region by the first voltage implanting. Thus, a portion of second oxide layer is remained on and over the surface of first-type ion region and second-type ion region that are both formed by the first voltage implanting. The fifth photoresist is removed. A third oxide layer is formed on the second silicon dioxide layer and semiconductor substrate. A first polysilicon layer is blanket and conformably formed on the third oxide layer. A sixth photoresist is formed on first polysilicon layer to define an opening in the first polysilicon layer, wherein the opening is located between the periphery region and the cell region. The first polysilicon layer is etched until the trench isolation region is exposed, so that opening is formed and the sixth photoresist is used as an etching mask. The sixth photoresist is removed. A fourth oxide layer is formed over first polysilicon layer and the opening. Next, a first nitride layer is formed over the fourth oxide layer. Then, a fifth oxide layer is formed over the first nitride layer. A seventh photoresist is formed over the fifth oxide layer located on cell region to expose the periphery region.

Consequentially, the fourth oxide layer, the second nitride layer and the fifth oxide layer located on periphery region are all etched until the surface of the trench isolations located under the opening being exposed, wherein the seventh photoresist is used as an etching mask for leaving portions of the fourth oxide layer, the second nitride layer and the fifth oxide layer located on the periphery region. The second polysilicon on is formed the first polysilicon located on the periphery region and on the third oxide layer located on the cell region. A eighth photoresist is formed on the active region of the second conductive layer, wherein the active regions being on the first ion region of the first conductivity type and the first ion region of the second conductivity type.

A portion of the second polysilicon layer, a portion of the first polysilicon layer, a portion of the third oxide layer and a portion of the second oxide layer are all etched until the surface of trench isolation is exposed. Thus, capacitor columns are formed, some of the capacitor columns include the second polysilicon layer, the first polysilicon layer and the third oxide layer located on the periphery region. Some of the capacitor columns include the second polysilicon layer, the first polysilicon layer, the third oxide layer and the second oxide layer on the periphery region. The other of capacitor columns include the second polysilicon layer, the fourth oxide layer, the first nitride layer, the fifth oxide layer, the first polysilicon layer and the third oxide layer on the cell region.

Although specific embodiments have been illustrated and described, it will be obvious to those skilled in the art that various modifications may be made without departing from what is intended to be limited solely by the appended claims.

What is claimed is:

1. A method for fabricating a nonvolatile memory on a semiconductor substrate, comprising the steps of:

forming a plurality of trench isolation regions in the semiconductor substrate, said isolation regions being separated from each other by an active region, wherein some of the active regions are located in a cell region of the semiconductor substrate, and the other of the active regions are located in a periphery region of the semiconductor substrate;

firstly implanting ions of a first conductivity type and ions of a second conductivity type into the active regions of the substrate, so that a first ion region of the first conductivity type and a first ion region of the second conductivity type are sequentially and respectively formed, wherein said firstly implanting step is performed by using a first photoresist layer and a second photoresist layer as masks;

secondly implanting ions of the first conductivity type and ions of the second conductivity type into the active regions of the substrate, so that a second ion region of the first conductivity type and a second ion region of the second conductivity type are sequentially and respectively formed, wherein said secondly implanting step is performed by using a third photoresist layer and a fourth photoresist layer as masks,;

growing a first oxide layer on said semiconductor substrate;

removing said first oxide layer;

growing a second oxide layer on said semiconductor substrate;

growing a third oxide layer on said second oxide layer;

blanket and conformably forming a first conductive layer on the third oxide layer;

forming a sixth photoresist on first conductive layer to define an opening in the first conductive layer, wherein said opening is located between the periphery region and the cell region;

etching the first conductive layer until the trench isolation region being exposed, so that opening is formed and the sixth photoresist is used as an etching mask;

removing the sixth photoresist;

sequentially forming a dielectric layer over the first conductive layer and the opening;

forming a seventh photoresist over the dielectric layer located on the cell region to expose the periphery region;

etching the dielectric layer located on the periphery region until the surface of the trench isolations located under the opening being exposed, wherein the seventh photoresist being used as an etching mask for leaving portions of the dielectric layer located on the periphery region;

forming a second conductive layer on the first conductive layer located on the periphery region and on the third oxide layer located on the cell region;

forming a eighth photoresist on the active region of the second conductive layer, wherein the active regions being on the first ion region of the first conductivity type and the first ion region of the second conductivity type; and etching a portion of the second conductive layer, a portion of the first conductive layer, a portion of the third oxide layer and a portion of the second oxide layer until the surface of trench isolation being exposed, so that capacitor columns being formed, some of the capacitor columns including the second conductive layer, the first conductive layer and the third oxide layer located on the periphery region, some of the capacitor columns including the second conductive layer, the first conductive layer, the third oxide layer and the second oxide layer on the periphery region, and the other of the capacitor columns including the second conductive layer, the dielectric layer, the first conductive layer and the third oxide layer on the cell region.

2. The method according to claim 1, wherein said semiconductor substrate comprises silicon.

3. The method according to claim 1, wherein said first voltage is higher than said second voltage.

4. The method according to claim 1, wherein said first conductivity type and second conductivity type comprises a p-type doping semiconductor.

5. The method according to claim 4, wherein dopant for said p-type doping semiconductor comprises boron.

6. The method according to claim 1, wherein said first conductivity type and second conductivity type comprises n-type doping semiconductor.

7. The method according to claim 1, wherein dopant for said n-type well is selected from the group consisting of arsemic and phosphorus.

8. The method according to claim 1, wherein said oxide layer comprises silicon oxide.

9. The method according to claim 1, wherein said conductive layer comprises polysilicon layer.

10. The method according to claim 1, wherein said dielectric layer comprises a silicon oxide layer, a silicon nitride layer and a silicon oxide layer.

11. The method according to claim 1, wherein said removing said photoresist layer comprises a dry plasma etching.

12. A method for fabricating a nonvolatile memory on a semiconductor substrate, comprising the steps of:

forming a plurality of trench isolation regions in the semiconductor substrate, said isolation regions being separated from each other by an active region, wherein some of the active regions are located in a cell region of the semiconductor substrate, and the other of the active regions are located in a periphery region of the semiconductor substrate;

firstly implanting ions of a first conductivity type into the active regions of the semiconductor substrate, so that a first ion region of the first conductivity type is formed, wherein said firstly implanting step is performed by using a first photoresist layer as mask;

removing the first photoresist;

firstly implanting ions of a second conductivity type into the active regions of the semiconductor substrate with a first voltage, so that a first ion region of the second conductivity type is formed, wherein said firstly implanting step is performed by using a second photoresist layer as mask, which is configures to make the first ion region of the second conductivity type be neighboring to the first ion region of the first conductivity type;

removing the second photoresist;

secondly implanting ions of the first conductivity type into the active regions of the semiconductor substrate, so that a second ion region of the first conductivity type is formed, wherein said secondly implanting step is performed by using a third photoresist layer as mask;

removing the third photoresist;

secondly implanting ions of the second conductivity type into the active regions of the semiconductor substrate, so that a second ion region of the second conductivity type is formed, wherein said secondly implanting step is performed by using a fourth photoresist layer as mask;

removing the fourth photoresist;

growing a first oxide layer on said semiconductor substrate;

removing said first oxide layer;

growing a second oxide layer on said semiconductor substrate;

removing a portion of second oxide, wherein fifth photoresist being used as an etching mask over first-type ion region on periphery region by first voltage implanting and the second-type region on periphery region by the first voltage implanting, so that a portion of second oxide layer being remained on and over the surface of the first conductivity type region and second conductivity type region that are both formed by the first voltage implanting;

removing said fifth photoresist;

growing a third oxide layer on the said second silicon dioxide layer and semiconductor substrate;

blanket and conformlly forming a first polysilicon layer on the third oxide layer;

forming a sixth photoresist on first polysilicon layer to define an opening in the first polysilicon layer, wherein said opening is located between the periphery region and the cell region;

etching the first polysilicon layer until the trench isolation region being exposed, so that opening is formed and the sixth photoresist is used as an etching mask;

removing the sixth photoresist;

forming a fourth oxide layer over first polysilicon layer and said opening;

forming a first nitride layer over the fourth oxide layer;

forming a fifth oxide layer over the first nitride layer;

forming a seventh photoresist over the fifth oxide layer located on cell region to expose the periphery region;

etching the fourth oxide layer, the second nitride layer and the fifth oxide layer located on periphery region until the surface of the trench isolations located under the opening being exposed, wherein the seventh photoresist being used as an etching mask for leaving portions of the fourth oxide layer, the second nitride layer and the fifth oxide layer located on the periphery region;

forming the second polysilicon on the first polysilicon located on the periphery region and on the third oxide layer located on the cell region;

forming a eighth photoresist on the active region of the second conductive layer, wherein the active regions being on the first ion region of the first conductivity type and the first ion region of the second conductivity type; and etching a portion of the second polysilicon layer, a portion of the first polysilicon layer, a portion of the third oxide layer and a portion of the second oxide layer until the surface of trench isolation being exposed, so that capacitor columns being formed, some of the capacitor columns including the second polysilicon layer, the first polysilicon layer and the third oxide layer located on the periphery region, some of the capacitor columns including the second polysilicon layer, the first polysilicon layer, the third oxide layer and the second oxide layer on the periphery region, and the other of capacitor columns including the second polysilicon layer, the fourth oxide layer, the first nitride layer, the fifth oxide layer, the first polysilicon layer and the third oxide layer on the cell region.

13. The method according to claim 12, wherein said semiconductor substrate comprises silicon.

14. The method according to claim 12, wherein said first voltage is higher than said second voltage.

15. The method according to claim 12, wherein said first conductivity type and second conductivity type comprises a p-type doping semiconductor.

16. The method according to claim 15, wherein dopant for said p-type well comprises boron.

17. The method according to claim 12, wherein said first conductivity type and second conductivity type comprises a n-type doping semiconductor.

18. The method according to claim 17, wherein dopant for said N-type doping semiconductor is selected from the group consisting of arsemic and phosphorus.

19. The method according to claim 12, wherein said oxide layer comprises silicon oxide.

20. The method according to claim 12, wherein said removing said photoresist layer comprises a dry plasma etching.

* * * * *